(12) United States Patent
Fu (10) Patent No.: US 7,984,392 B2
(45) Date of Patent: Jul. 19, 2011

(54) MATCHING METHOD FOR DESIGNING LAYOUT PATTERNS ON A PHOTOMASK FROM INVERSE LITHOGRAPHY

(75) Inventor: Kuo-Kuei Fu, Taoyuan County (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 291 days.

(21) Appl. No.: 12/348,470

(22) Filed: Jan. 5, 2009

(65) Prior Publication Data

US 2010/0104954 A1    Apr. 29, 2010

(30) Foreign Application Priority Data

Oct. 27, 2008  (TW) ................. 97141254 A (51) Int. Cl.
*G06F 17/50* (2006.01)
*G03F 1/00* (2006.01)
(52) U.S. Cl. ................. 716/52; 716/53; 716/54; 716/55
(58) Field of Classification Search ................ 716/50–55
See application file for complete search history.

(56) References Cited

U.S. PATENT DOCUMENTS

| 5,497,334 | A | * | 3/1996 | Russell et al. | 716/52 |
| 5,528,508 | A | * | 6/1996 | Russell et al. | 716/55 |
| 2004/0031006 | A1 | * | 2/2004 | Kamon | 716/119 |
| 2005/0125763 | A1 | * | 6/2005 | Lin et al. | 716/55 |
| 2005/0268270 | A1 | * | 12/2005 | Kamon | 716/103 |
| 2007/0124718 | A1 | * | 5/2007 | Kobayashi et al. | 430/5 |
| 2007/0156379 | A1 | * | 7/2007 | Kulkarni et al. | 703/14 |

* cited by examiner

*Primary Examiner* — Mark F Huff
*Assistant Examiner* — John Ruggles
(74) *Attorney, Agent, or Firm* — Volpe And Koenig, P.C.

(57) ABSTRACT

The present invention relates to a matching method of pattern layouts from inverse lithography, which makes the pattern cells in the same groups identical to avoid a repeated verification and to improve the yield. The method comprises the step of: analyzing a target designed layout by hierarchy; categorizing the pattern cells with the same shape into a group; inversing the target designed layout by inverse lithography; inspecting the inversed pattern cells in the group with each other and replacing the variant ones to make all the inversed pattern cells identical.

17 Claims, 8 Drawing Sheets

MATCHING METHOD FOR DESIGNING LAYOUT PATTERNS ON A PHOTOMASK FROM INVERSE LITHOGRAPHY

FIELD OF THE INVENTION

The present invention generally relates to a matching method of pattern layouts from inverse lithography. In particular, the matching method comprises the step of: analyzing a design layout by hierarchy; categorizing the cells with the same pattern into a group; inversing the design layout by inverse lithography; assimilating the inversed layout cells in the same group into a selected inversed layout cell.

BACKGROUND OF THE INVENTION

Nowadays the most of integrated circuits (ICs) are created by designers using computer programs. Designers define the functionalities of the circuit and analyze them by using computer programs to obtain the electronic equivalent of a circuit diagram.

In order to convert the circuit diagram into a physical integrated circuit, a place and route tool is needed to arrange every electronic component and to construct the wiring to interconnect them for a design layout. Besides, the layers of the layout are to be fabricated as a set of photomask used in the photolithographic processing. Before translating the design layout into a photomask layout, the design layout will be processed by a inverse lithography method and then analyzed by another computer programs to ensure there is no wrong pattern or to modify the wrong patterns.

In the photolithography processing, the biggest problem is the image error due to the diffraction effect, but an optical proximity correction method or other prior methods can be used to compensate the distortions. For instance, the optical proximity correction method can correct the wrong patterns by scattering bars to overcome the problem caused by the diffraction effect.

A hierarchical method plays an important role for the inverse lithography method. This is because the hierarchical method can analyze the design layout to make a hierarchical structure having a plurality of design layout cells with different patterns. In addition, the hierarchical structure can also be used in the optical proximity correction method.

Figure 1:
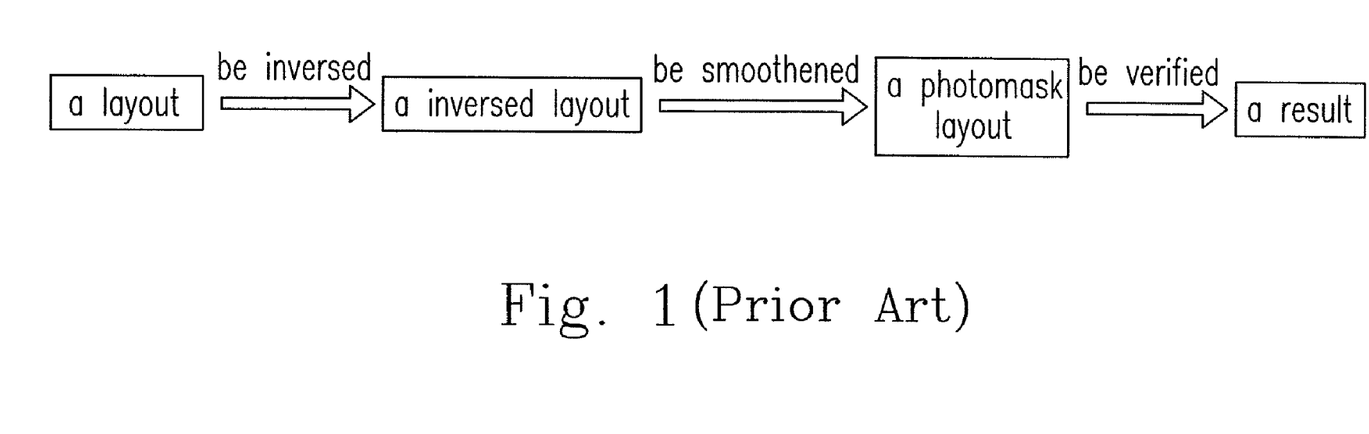
FIG. 1 shows a flow chart of a prior inverse lithography.
Figure 2A:
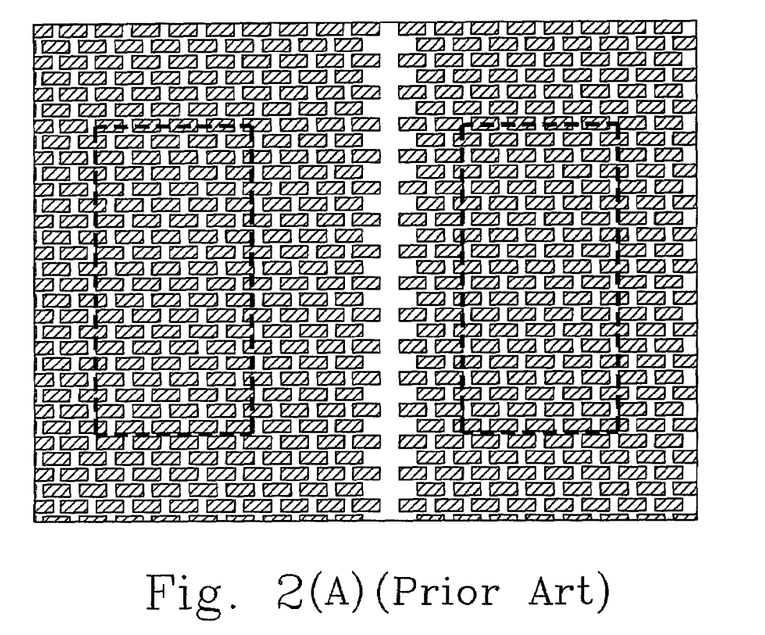
FIG. 2(A) shows a prior design layout.

Please refer to FIG. 1, which shows a flow chart of a prior inverse lithography. It illustrates that inversing a design layout by a inverse lithography method to obtain a inversed design layout; smoothening the inversed design layout to obtain a photomask layout; and then verifying. FIG. 2(A) shows a design layout and FIG. 2(B) shows a photomask layout produced by a prior flow.

Figure 2B:
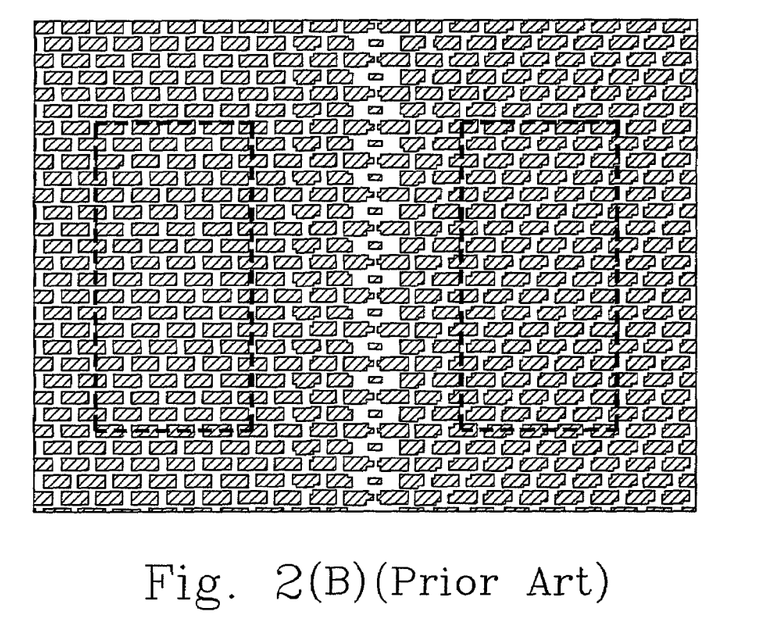
FIG. 2(B) shows a photomask layout produced by a prior flow.

In the above prior flow, there is usually an existing problem that the unexpectedly different photomask patterns as FIG. 2(B) are produced even in the same design layout condition as FIG. 2(A). It may take much time for verifying the photomask layout once we have doubts about the photomask layout. In addition, using the wrong photomask may cause the yield to decrease. In the technology industry nowadays, the less wasted time the more competitiveness and the higher yield the higher productivity.

In order to overcome the drawbacks of the prior flow, the inventors research and experiment without giving up, and finally invent "Matching Method Of Pattern Layouts From Inverse Lithography" to overcome the drawbacks. The summary of the present invention is described as follows.

SUMMARY OF THE INVENTION

The object of the present invention is to provide a matching method for layout patterns, which makes all patterns in a group identical through categorizing patterns into groups, inspecting the processed patterns and replacing variant processed patterns by a selected one. The purpose of the method is to settle the existing problem that unexpectedly different photomask patterns are produced from the same design layout pattern in the same condition. Then, time will be saved for not verifying the photomask layout several times and the yield will increase.

According to one aspect of the present invention, a matching method for layout patterns is provided. A matching method for layout patterns, comprising the steps of: (a) providing a layout having a plurality of initial layout cells; (b) using a hierarchical method to obtain a hierarchical structure having the plurality of initial layout cells; (c) categorizing ones of the plurality of initial layout cells having a specific pattern into a group; (d) inversing the layout to obtain an inversed layout having a plurality of inversed layout cells corresponding to the plurality of initial layout cells; (e) smoothening the inversed layout to obtain a photomask layout having a plurality of photomask layout cells corresponding to the plurality of initial layout cells; and (f) assimilating the photomask layout cells in the group into a selected photomask cell to obtain an assimilated photomask layout.

Preferably, the matching method is provided, wherein ones of the plurality of initial layout cells in the group consists of a specific pattern.

Preferably, the matching method is provided, wherein the step (f) further includes a step of verifying the assimilated photomask layout by an optical rule check.

Preferably, the matching method is provided, wherein at least one of the plurality of layout cells in the step (b) further includes a plurality of patterns.

Preferably, the matching method is provided, wherein the step (d) further includes a step of modifying the inversed layout by an optical proximity correction method.

Preferably, the matching method is provided, wherein the step (f) further includes a step of fine-tuning the assimilated photomask layout.

Preferably, the matching method is provided, wherein the step (f) further includes a step of simulating the plurality of photomask layout cells and then selecting one of the plurality of photomask layout cells as the selected photomask cell.

Preferably, the matching method is provided, wherein the hierarchical structure of the step (b) is obtained by analyzing the layout with a hierarchical method.

Preferably, the matching method is provided, wherein the inversed layout of the step (d) is obtained by an inverse lithography method.

According to one aspect of the present invention, a matching method is provided. A matching method, comprising the steps of: (a) using a hierarchical method to obtain a hierarchical structure having a plurality of initial layout cells from a layout; (b) categorizing the plurality of initial layout cells into specific groups, each of which includes ones of plurality of initial layout cells having a specific pattern; (c) inversing the layout to obtain an inversed layout having a plurality of inversed layout cells corresponding to both the plurality of initial layout cells and the specific groups; (d) inspecting the inversed layout cells in a same respective specific group to find out any variant inversed layout cell therefrom; and (e) causing all the inversed layout cells in the same specific group identical.

Preferably, the matching method is provided, wherein each of the specific groups consists of ones of plurality of initial layout cells consisting of a specific pattern.

Preferably, the matching method is provided, wherein at least one of the plurality of layout cells further includes a plurality of patterns.

Preferably, the matching method is provided, wherein the step (c) further includes a step of modifying the inversed layout by an optical proximity correction method.

Preferably, the matching method is provided, wherein the step (d) further includes a step of simulating the plurality of inversed layout cells and then selecting one of the plurality of inversed layout cells as a selected inversed layout cell, and the variant inversed layout cell is a specific one having a condition being one selected from a group consisting of a shape, a size and a combination thereof different from a corresponding condition of the selected inversed layout cell.

Preferably, the matching method is provided, wherein the step (e) is achieved by replacing the variant inversed layout cell by the selected inversed layout cell, and all the inversed layout cells in the same specific group have shapes and sizes identical to those of the selected inversed layout cell.

Preferably, the matching method is provided, wherein the step (e) further includes a step of taking the replaced inversed layout for a photomask layout.

Preferably, the matching method is used for matching layout patterns.

According to one aspect of the present invention, replaced photomask is provided. A replaced photomask comprising: a substrate; and a plurality of etched patterns formed on the substrate according to a photomask layout which has a plurality of photomask layout patterns categorized into a plurality of first groups each of which includes a plurality of identical initial layout patterns, and is reproduced from an initial layout having a plurality of initial layout patterns categorized into a plurality of second groups to which the plurality of first groups respectively correspond, wherein the plurality of photomask layout patterns respectively correspond to the plurality of initial layout patterns and at least one of the plurality of the photomask layout patterns is replaced by a standardized photomask layout pattern.

Preferably, the replaced photomask is provided, wherein the plurality of photomask layout patterns are obtained from inversing the plurality of initial layout patterns of an initial layout.

Preferably, the replaced photomask is provided, wherein the at least one of the plurality of photomask layout patterns is automatically replaced by an algorithm.

Preferably, the replaced photomask is provided, wherein each of the plurality of first groups each of which consists of a plurality of identical initial layout patterns.

Preferably, the replaced photomask is provided, wherein all the identical initial layout patterns have the same shape and the same size.

Preferably, the replaced photomask is provided, wherein the standardized photomask layout pattern is determined by simulating the plurality of photomask layout patterns and then by selecting one of the plurality of photomask layout patterns as the standardized photomask layout pattern according to a result of the simulation.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

Figure 3:
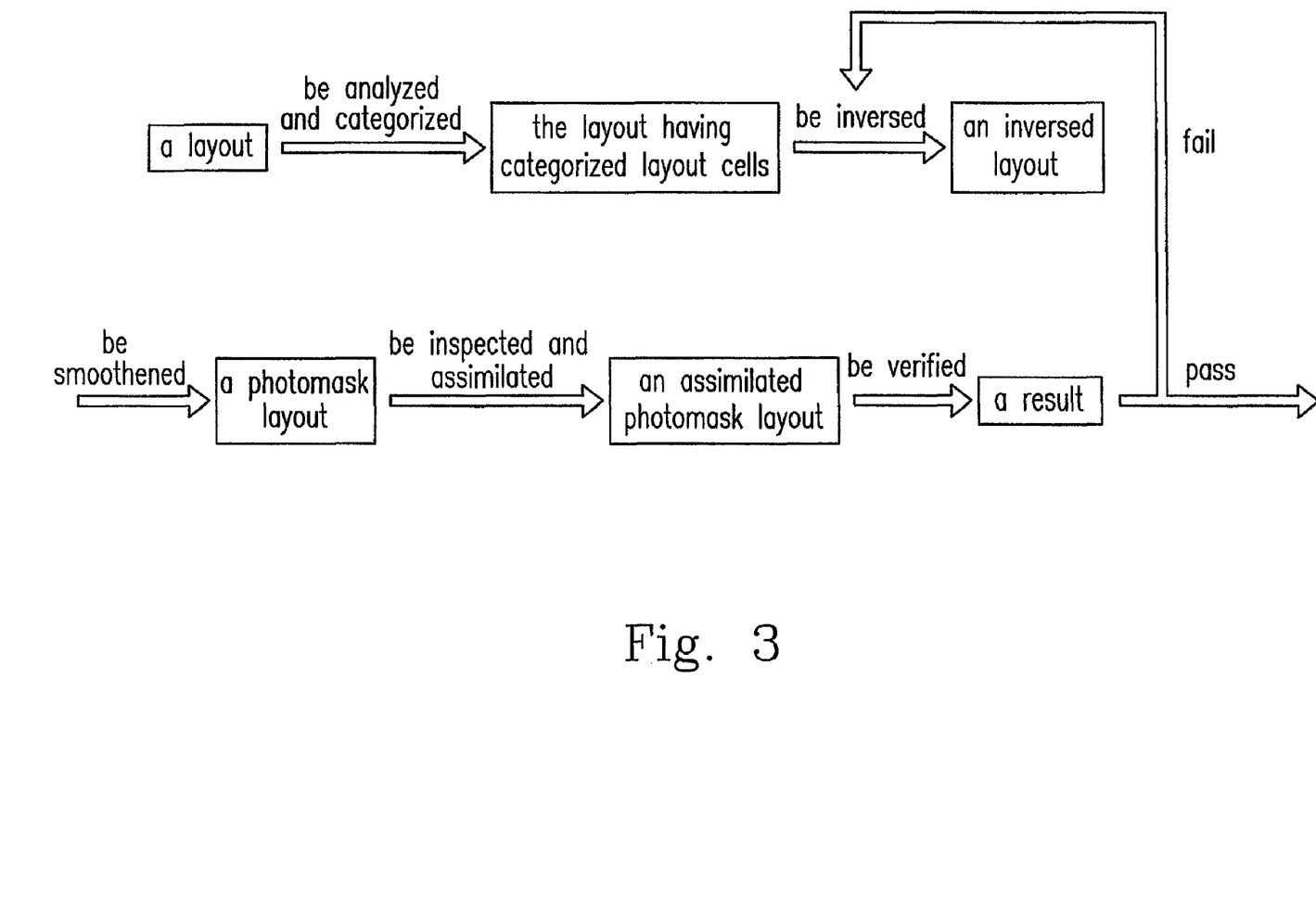
FIG. 3 shows a flow chart of the first preferable embodiment.

Please refer to FIG. 3, which shows a flow chart of the first preferable embodiment to make photomask layout cells in the group identical for shape and size. The method is usually executed by a prior computer program as follows.

Firstly, provide a layout having a plurality of initial layout cells which may be different (shape or size) or the same (shape and size). Please refer to FIG. 4, which shows a layout.

Figure 4:
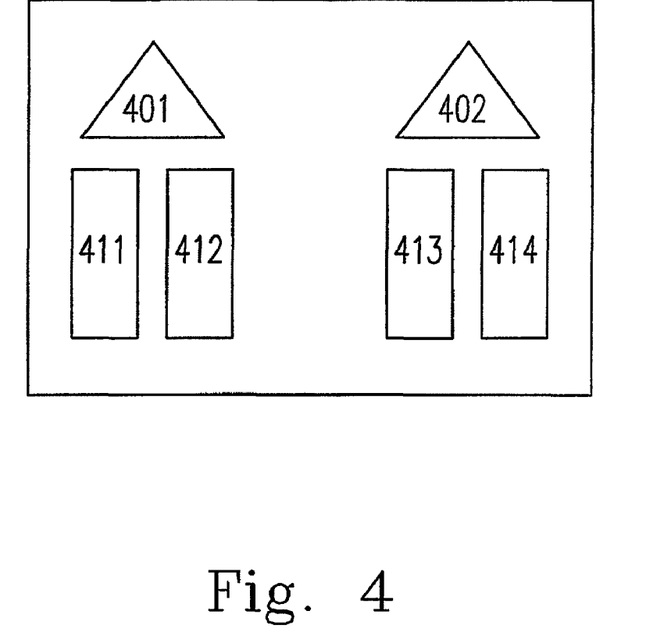
FIG. 4 shows a layout.

Then, analyze the layout by a method, especially a hierarchical method to obtain a hierarchical structure having the plurality of initial layout cells. The purpose of using the hierarchical method is to categorize ones of the plurality of initial layout cells having (or consisting of) a specific pattern into a group. In FIG. 4, the initial layout cells 401 and 402 have the same patterns. In order to make the layout and the photomask layout be inspected conveniently and match with each other, ones of the plurality of initial layout cells having (or consisting of) a specific pattern are categorized into a group. By the same way, the initial layout cells 411, 412, 413 and 414 are categorized into a group.

Figure 5:
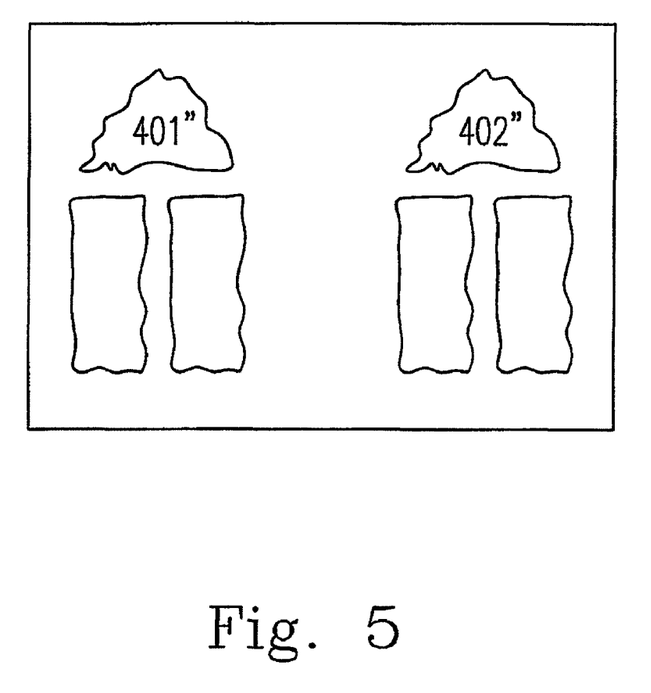
FIG. 5 shows an inversed layout from the initial layout.

Afterward, inverse the layout by a method, especially an inverse lithography method to obtain an inversed layout having a plurality of inversed layout cells respectively corresponding to the plurality of initial layout cells. Please refer to FIG. 5 which shows an inversed layout from the initial layout.

To make fabricating a photomask more convenient, complicated patterns in the inversed layout must be simplified to provide a photomask layout, i.e. smoothen the uneven patterns to cause them flat, so that the photomask layout can be easily used for fabricating a photomask. Please refer to FIG. 6, which shows a photomask layout from the inversed layout. The photomask layout has a plurality of photomask layout cells respectively corresponding to the plurality of initial layout cells. The photomask layout cells 401' and 402' are respectively corresponding to the initial layout cells 401 and 402, and the photomask layout cells 411' 412' 413' and 414' are respectively corresponding to the initial layout cells 411, 412, 413 and 414.

Figure 6:
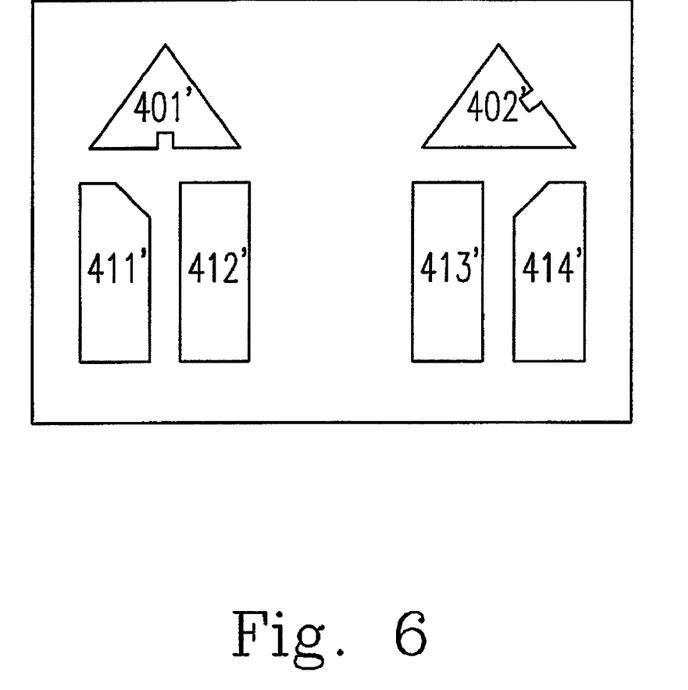
FIG. 6 shows a photomask layout from the inversed layout.

In FIG. 6, the photomask layout cells 401' and 402' have different patterns, but the initial layout cells they respectively correspond to are in the group. In order to make the photomask cells in a same respective group identical, the photomask layout cells in the same respective group must be inspected to find out any variant photomask layout cell, i.e. any different pattern in the same photomask cell group. Then all the photomask layout cells in the group can be caused identical (shape and size) to each other by replacing the variant ones with a selected one according to a result of the inspection. The above step is also called "assimilating." Please refer to FIG. 7, which shows an assimilated photomask layout from the photomask layout.

Figure 7:
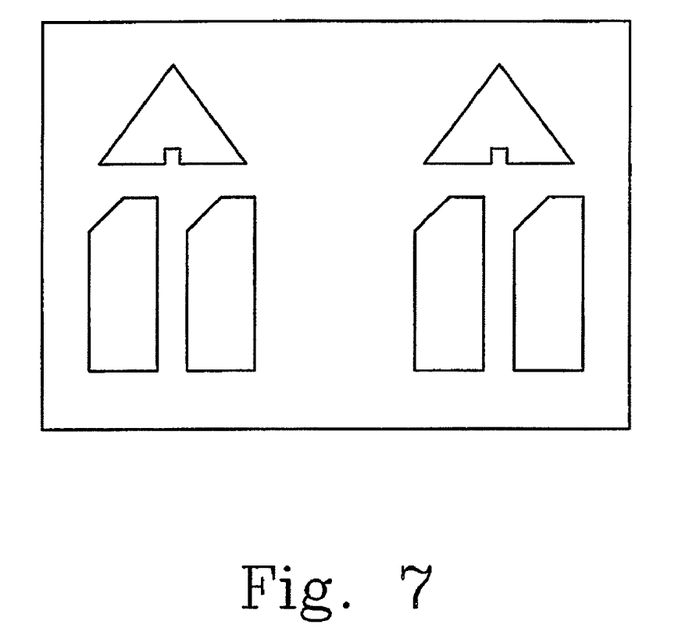
FIG. 7 shows an assimilated photomask layout form the photomask layout.

Finally, the assimilated photomask layout must be verified by an optical rule check to check whether the assimilated phtomask layout can be used for fabricating a photomask or not. There are many companies including Mentor, Synopsys and so on, which have developed computer programs related to an optical rule check. If the result of an optical rule check is not expected, the initial layout must be inversed again and the above steps must keep repeated till the result meets the requirement. This is to say, the photomask layout cells corresponding to the same initial layout cell group should have the same pattern.

Figure 8:
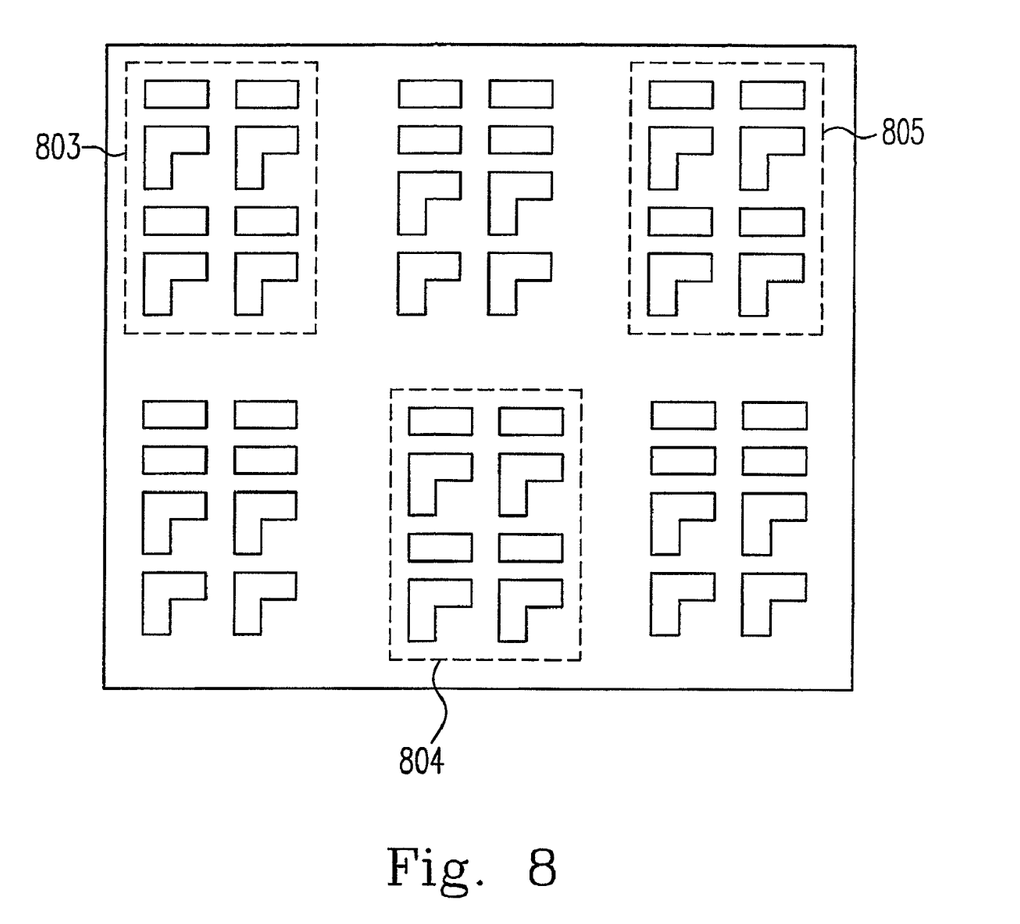
FIG. 8 shows layout cells having a plurality of patterns.

According to the above embodiment, the combination of at least two patterns can be defined as a layout cell. The layout cells in a group have not only the same combination of patterns but also the distances among these patterns identical to those in each layout cells in the group. Please refer to FIG. 8, which shows layout cells having a plurality of patterns The initial layout cells 803, 804 and 805 having a plurality of patterns are categorized into a group.

Besides, there is usually an existing problem caused by the diffraction effects. In order to solve this problem, an optical proximity correction method is used to modify the inversed layout and then make the inversed layout have a plurality of patterns modified by the optical proximity correction method and a plurality of scattering bars.

In addition, the assimilated photomask layout sometime maybe not meet the requirements of custom specification for a company, so the assimilated photomask layout must be fine-tuned to meet the requirement.

In order to find out the most suitable photomask layout cell as a selected photomask layout cell but not choosing one at random, simulating the plurality of photomask layout cells is needed to seek the best one as the selected photomask layout cell according to the result of the simulation and then replace all the photomask layout cells in the group with the selected photomask layout cell. The simulation can be executed by the above prior computer program.

Figure 9:
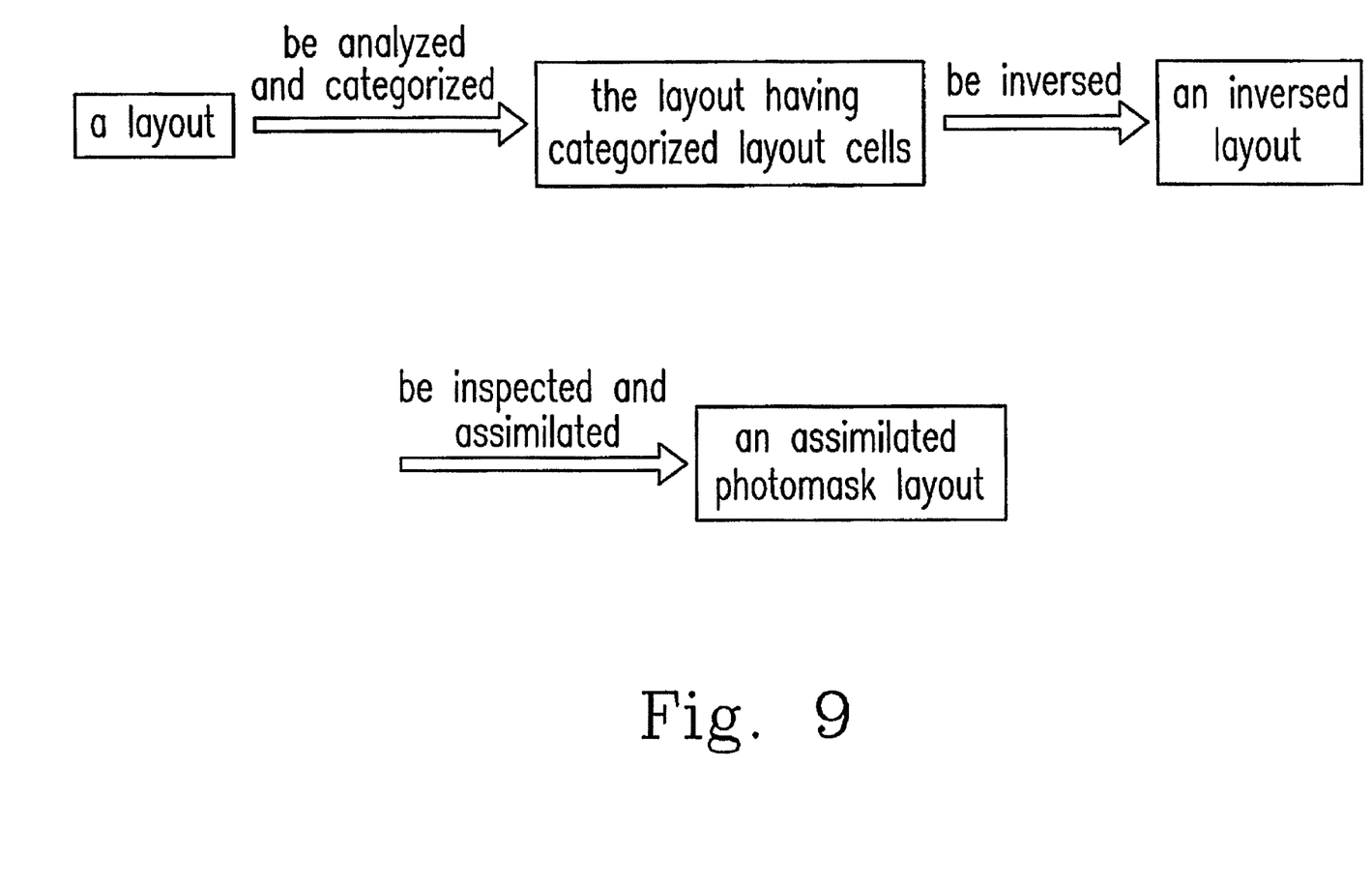
FIG. 9 shows a flow chart of the second preferable embodiment.

Please refer to FIG. 9, which shows a flow chart of the second preferable embodiment to make inversed layout cells in the group identical for shape and size. The method is usually executed by a prior computer program as follows.

Firstly, provide a layout having a plurality of patterns which may be different (shape or size) or the same (shape and size). Please refer to FIG. 4, which shows a layout.

Then, analyze the layout by a method, specially a hierarchical method to obtain a hierarchical structure having the plurality of initial layout cells. The purpose of using the hierarchical method is to categorize ones of the plurality of initial layout cells having (or consisting of) a specific pattern into a group. In FIG. 4, the initial layout cells 401 and 402 have the same patterns. In order to make the layout and the photomask layout be inspected conveniently and match with each other, ones of the plurality of initial layout cells having (or consisting of) a specific pattern are categorized into a group. By the same way, the initial layout cells 411, 412, 413 and 414 are categorized into a group.

Afterward, inverse the layout by a method, especially an inverse lithography method to obtain an inversed layout having a plurality of inversed layout cells 401" and 402" respectively corresponding to the plurality of initial layout cells 401 and 402. Please refer to FIG. 5, which shows an inversed layout from the initial layout. The inversed layout cells 401" and 402" have different patterns, but the initial layout cells they respectively correspond to are in the group. In order to make the inversed layout cells in a same respective group identical, the inversed layout cells in the same respective group must be inspected to find out any variant inversed layout cell therefrom, i.e. any different pattern in the same inversed layout cell group. Then all the inversed layout cells in the group can be caused identical (shape and size) to each other by replacing the variant ones with a selected one according to a result of the inspection. Then, the replaced inversed layout can be taken for a photomask layout.

According to the above embodiment, the combination of at least two patterns can be defined as a layout cell. The layout cells in a group have not only the same combination of patterns but also the distances among these patterns identical to those in each layout cells in the group. Please refer to FIG. 8, which shows layout cells having a plurality of patterns, wherein the initial layout cells 803, 804 and 805 having a plurality of patterns are categorized into a group.

Besides, there is usually an existing problem caused by the diffraction effects. In order to solve this problem, an optical proximity correction method is used to modify the inversed layout and then make the inversed layout have a plurality of patterns modified by the optical proximity correction method and a plurality of scattering bars.

In order to find out the most suitable photomask layout cell as a selected photomask layout cell but not choosing one at random, simulating the plurality of photomask layout cells is needed to seek the best one as the selected photomask layout cell according to the result of the simulation and then replace all the photomask layout cells in the group with the selected photomask layout cell. The simulation can be executed by the above prior computer program.

The present invention makes all patterns in a group identical through categorizing patterns into groups, inspecting the processed patterns and replacing variant processed patterns by a selected one. The purpose of the method is to solve the existing problem that the different photomask patterns produced from the same design layout pattern in the same condition, and to save time for not verifying the photomask layout several times and to increase the yield.

Figure 10:
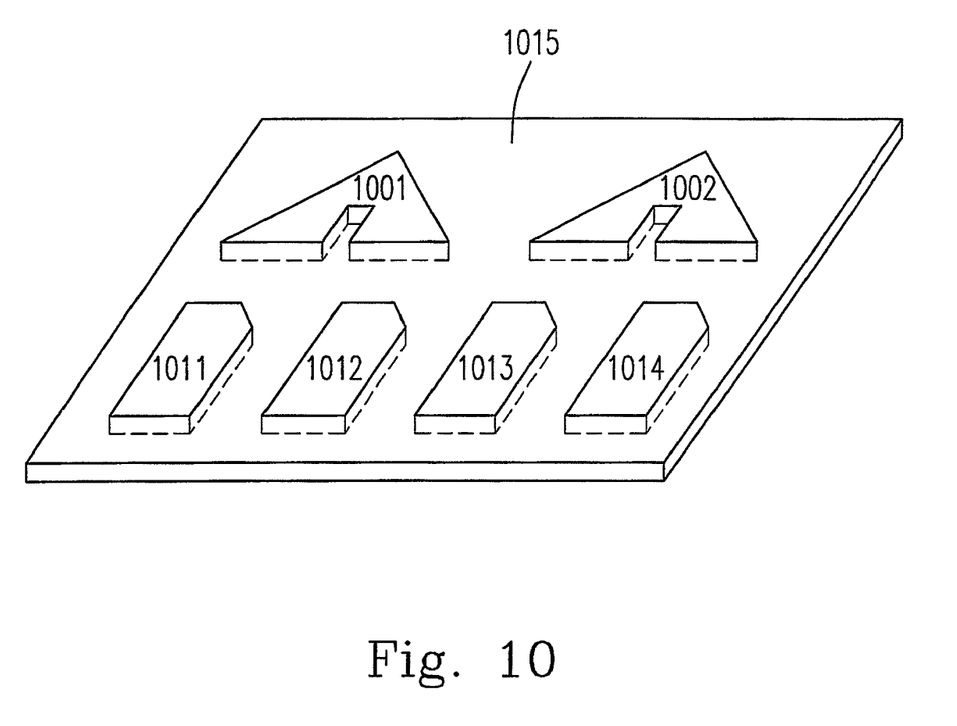
FIG. 10 shows a replaced photomask.

Please refer to FIG. 10, which shows a replaced photomask. The replaced photomask comprises a substrate 1015 and a plurality of etched patterns 1001, 1002, 1011, 1012, 1013 and 1014 formed on the substrate 1015. These etched patterns are formed according to a photomask layout which has a plurality of photomask layout patterns categorized into a plurality of first groups each of which includes (or consists of) a plurality of identical initial layout patterns, wherein all the identical initial layout patterns have the same shape and the same size. The photomask layout is inversed from an initial layout having a plurality of initial layout patterns categorized into a plurality of second groups to which the plurality of first groups respectively correspond.

Besides, the plurality of photomask layout patterns respectively correspond to the plurality of initial layout patterns and through an algorithm at least one of the plurality of the photomask layout patterns is replaced by a standardized photomask layout pattern determined by simulating the plurality of photomask layout patterns and then by selecting one of the plurality of photomask layout patterns as the standardized photomask layout pattern according to a result of the simulation, wherein the algorithm execute the step of replacing at least one of the plurality of the photomask layout patterns automatically by a standardized photomask layout pattern.

Whereas alternations and modifications of the present invention will no doubt be apparent to a person of ordinary skilled in the art, it is to be understood that the embodiments shown and described by way of illustration are by no means intended to be considered limitation. Accordingly, it is to be intended by the claims to cover all alternations of the invention which fall in the spirit and scope of the invention.

What is claimed is:

1. A matching method for designing layout patterns on a photomask, comprising the steps of:
   (a) providing a layout having a plurality of initial layout cells;
   (b) using a hierarchical method to obtain a hierarchical structure having the plurality of initial layout cells;
   (c) categorizing ones of the plurality of initial layout cells having a specific pattern into a group;
   (d) inversing the layout to obtain an inversed layout having a plurality of inversed layout cells corresponding to the plurality of initial layout cells;
   (e) smoothening the inversed layout to obtain a photomask layout having a plurality of photomask layout cells corresponding to the plurality of initial layout cells; and
   (f) assimilating the photomask layout cells in the group into a selected photomask cell to obtain an assimilated photomask layout.

2. A matching method as claimed in claim 1, wherein ones of the plurality of initial layout cells in the group consists of a specific pattern.

3. A matching method as claimed in claim 1, wherein the step (f) further includes a step of verifying the assimilated photomask layout by an optical rule check.

4. A matching method as claimed in claim 1, wherein at least one of the plurality of layout cells in the step (b) further includes a plurality of patterns.

5. A matching method as claimed in claim 1, wherein the step (d) further includes a step of modifying the inversed layout by an optical proximity correction method.

6. A matching method as claimed in claim 5, wherein the step (f) further includes a step of fine-tuning the assimilated photomask layout.

7. A matching method as claimed in claim 6, wherein the step (f) further includes a step of simulating the plurality of photomask layout cells and then selecting one of the plurality of photomask layout cells as the selected photomask cell.

8. A matching method as claimed in claim 1, wherein the hierarchical structure of the step (b) is obtained by analyzing the layout with a hierarchical method.

9. A matching method as claimed in claim 1, wherein the inversed layout of the step (d) is obtained by an inverse lithography method.

10. A matching method for designing layout patterns on a photomask, comprising the steps of:
    (a) using a hierarchical method to obtain a hierarchical structure having a plurality of initial layout cells from a layout;
    (b) categorizing the plurality of initial layout cells into specific groups, each of which includes ones of the plurality of initial layout cells having a specific pattern;
    (c) inversing the layout to obtain an inversed layout having a plurality of inversed layout cells corresponding to both the plurality of initial layout cells and the specific groups;
    (d) inspecting the inversed layout cells in a same respective specific group to find out any variant of an inversed layout cell therefrom; and
    (e) causing all of the inversed layout cells in the same specific group to be identical.

11. A matching method as claimed in claim 10, wherein each of the specific groups consists of ones of a plurality of initial layout cells consisting of a specific pattern.

12. A matching method as claimed in claim 10, wherein at least one of the plurality of layout cells further includes a plurality of patterns.

13. A matching method as claimed in claim 12, wherein the step (c) further includes a step of modifying the inversed layout by an optical proximity correction method.

14. A matching method as claimed in claim 13, wherein the step (d) further includes a step of simulating the plurality of inversed layout cells and then selecting one of the plurality of inversed layout cells as a selected inversed layout cell, and the variant of the inversed layout cell is a specific one having a condition being one selected from a group consisting of a shape, a size and a combination thereof different from a corresponding condition of the selected inversed layout cell.

15. A matching method as claimed in claim 14, wherein the step (e) is achieved by replacing the variant of the inversed layout cell by the selected inversed layout cell, and replacing all of the inversed layout cells in the same specific group having shapes and sizes identical to those of the selected inversed layout cell.

16. A matching method as claimed in claim 15, wherein the step (e) further includes a step of taking the replaced inversed layout for a photomask layout.

17. A matching method as claimed in claim 10, used for matching layout patterns.

* * * * *